(12) United States Patent
Bandiera et al.

(10) Patent No.: US 9,431,601 B2
(45) Date of Patent: Aug. 30, 2016

(54) MAGNETORESISTIVE ELEMENT WITH OXYGEN GETTING LAYER HAVING ENHANCED EXCHANGE BIAS AND THERMAL STABILITY FOR SPINTRONIC DEVICES

(71) Applicant: CROCUS Technology SA, Grenoble (FR)

(72) Inventors: Sebastien Bandiera, Corenc (FR); Ioan Lucian Prejbeanu, Seyssinet Pariset (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/647,632

(22) PCT Filed: Nov. 19, 2013

(86) PCT No.: PCT/EP2013/074191
§ 371 (c)(1),
(2) Date: May 27, 2015

(87) PCT Pub. No.: WO2014/082896
PCT Pub. Date: Jun. 5, 2014

(65) Prior Publication Data
US 2015/0340597 A1     Nov. 26, 2015

(30) Foreign Application Priority Data
Nov. 28, 2012   (EP) ..................................... 12290416

(51) Int. Cl.
*H01L 27/22*      (2006.01)
*H01L 43/12*      (2006.01)
*H01L 29/82*      (2006.01)
(Continued)

(52) U.S. Cl.
CPC ............. *H01L 43/08* (2013.01); *G11C 11/161* (2013.01); *H01F 10/3254* (2013.01); *H01F 41/303* (2013.01); *H01L 43/02* (2013.01)

(58) Field of Classification Search
CPC ..... H01L 43/08; H01L 43/12; H01L 27/222; H01L 27/228; H01L 29/82
See application file for complete search history.

(56) References Cited

U.S. PATENT DOCUMENTS

| 8,962,493 B2 * | 2/2015 | Levi | H01L 43/08 257/E21.665 |
| 8,981,505 B2 * | 3/2015 | Moriyama | G11C 11/161 257/421 |

(Continued)

OTHER PUBLICATIONS

International Search Report for PCT/EP2013/074191 dated Jan. 22, 2014.
(Continued)

*Primary Examiner* — Thanh V Pham
(74) *Attorney, Agent, or Firm* — Pearne & Gordon LLP

(57) ABSTRACT

Magnetic element including a first magnetic layer having a first magnetization; a second magnetic layer having a second magnetization; a tunnel barrier layer between the first and the second magnetic layers; and an antiferromagnetic layer exchanged coupling the second magnetic layer such that the second magnetization is pinned below a critical temperature of the antiferromagnetic layer, and can be freely varied when the antiferromagnetic layer is heated above that critical temperature. The magnetic element also includes an oxygen gettering layer between the second magnetic layer and the antiferromagnetic layer, or within the second magnetic layer. The magnetic element has reduced insertion of oxygen atoms in the antiferromagnetic layer and possibly reduced diffusion of manganese in the second magnetic layer resulting in an enhanced exchange bias and/or enhanced resistance to temperature cycles and improved life-time.

7 Claims, 1 Drawing Sheet

(51) Int. Cl.
  *H01L 43/08* (2006.01)
  *H01L 43/02* (2006.01)
  *G11C 11/16* (2006.01)
  *H01F 10/32* (2006.01)
  *H01F 41/30* (2006.01)

(56) References Cited

U.S. PATENT DOCUMENTS

2004/0042246 A1 3/2004 Drewes et al.
2004/0145850 A1 7/2004 Fukumoto et al.
2004/0160810 A1 8/2004 Deak et al.
2006/0018057 A1 1/2006 Huai
2007/0279977 A1 12/2007 Banerjee et al.
2008/0179699 A1 7/2008 Horng et al.
2009/0085058 A1 4/2009 Mather et al.

OTHER PUBLICATIONS

Written Opinion for PCT/EP2013/074191 dated Jan. 22, 2014.

* cited by examiner

MAGNETORESISTIVE ELEMENT WITH OXYGEN GETTING LAYER HAVING ENHANCED EXCHANGE BIAS AND THERMAL STABILITY FOR SPINTRONIC DEVICES

FIELD

The present invention concerns a magnetoresistive element comprising a magnetic tunnel junction, the magnetoresistive element having enhanced exchange bias and enhanced stability to temperature cycles and improved lifetime.

DESCRIPTION OF RELATED ART

Spintronic devices such as MRAM cells and devices based on MRAM cells, spin transfer torque oscillators or magnetic logic units, usually comprise a magnetic tunnel junction including a reference or sense layer, a tunnel barrier layer and a storage layer exchange-coupled or not with an antiferromagnetic layer. The antiferromagnetic layer is arranged to pin a magnetization of the ferromagnetic layer below a critical temperature of the antiferromagnetic layer and to free it above the critical temperature threshold. The exchange-coupling is occurring via a so-called exchange bias appearing when the antiferromagnetic layer is in contact with the ferromagnetic layer. The exchange bias is thus of great importance in the functioning of the spintronic devices.

The exchange bias phenomenon is characterized by a shifted magnetization hysteresis loop measured for pinned ferromagnetic layer, as a function of an applied magnetic field. The exchange bias can be affected by the oxidation of the antiferromagnetic layer cause by the inevitable presence of residual oxygen atoms in the deposition chamber and introduced in the antiferromagnetic layer during the deposition process of the antiferromagnetic layer. Moreover, diffusion of Mn atoms from the Mn containing antiferromagnetic layer into the adjacent ferromagnetic layer during annealing operations may result in a further reduction of the exchange bias and increases the coercivity of the storage layer. More generally, the manganese migration leads to a decrease of the magnetoresistance and an increase of the surface resistance in magnetic tunnel junctions.

US2008179699 discloses a MTJ that minimizes spin-transfer magnetization switching current (Jc) in a Spin-RAM to <1×10$^6$ A/cm$^2$ is disclosed. The MTJ has a Co$_{60}$Fe$_{20}$B$_{20}$/MgO/Co$_{60}$Fe$_{20}$B$_{20}$ configuration where the CoFeB AP1 pinned and free layers are amorphous and the crystalline MgO tunnel barrier is formed by a ROX or NOX process. The capping layer preferably is a Hf/Ru composite where the lower Hf layer serves as an excellent oxygen getter material to reduce the magnetic "dead layer" at the free layer/capping layer interface and thereby increase dR/R, and lower He and Jc. The annealing temperature is lowered to about 280° C. to give a smoother CoFeB/MgO interface and a smaller offset field than with a 350° C. annealing.; In a second embodiment, the AP1 layer has a CoFeB/CoFe configuration wherein the lower CoFeB layer is amorphous and the upper CoFe layer is crystalline to further improve dR/R and lower RA to =<10 OHM/µM$^2$.

US2007279977 discloses a semiconductor magnetic memory device has a magnetic tunneling junction formed over a memory cell. The memory cell has a control gate surrounded by a floating gate. The floating gate is coupled to the magnetic tunneling junction through a pinning layer that maintains the magnetic orientation of the lower magnetic layer of the junction. A current through a selected word line, coupled to the control gate, generates a first magnetic field. A current through a cell select line generates a second magnetic field that is orthogonal to the first magnetic field. This changes the magnetic orientation of the upper magnetic layer of the junction to lower its resistance, thus allowing a write/erase voltage on a program/erase line to program/erase the floating gate.

SUMMARY

The present disclosure concerns a magnetoresistive element comprising a first magnetic layer having a first magnetization; a second magnetic layer having a second magnetization; a tunnel barrier layer comprised between the first and the second magnetic layers; and an antiferromagnetic layer exchanged coupling the second magnetic layer such that the second magnetization can be freely varied when the antiferromagnetic layer is heated above a critical temperature; the magnetic element further comprising an oxygen gettering layer which comprises material that has better oxygen gettering properties than the antiferromagnetic layer and/or the second magnetic layer, and wherein the oxygen getting layer is arranged in the magnetoresistive element such that it can block diffusion of manganese from the antiferromagnetic layer into the second magnetic layer.

The magnetoresistive element disclosed herein has reduced insertion of oxygen atoms in the antiferromagnetic layer and/or reduced diffusion of manganese in the second magnetic layer resulting in an enhanced exchange bias and enhanced resistance to temperature cycles and improved life-time.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
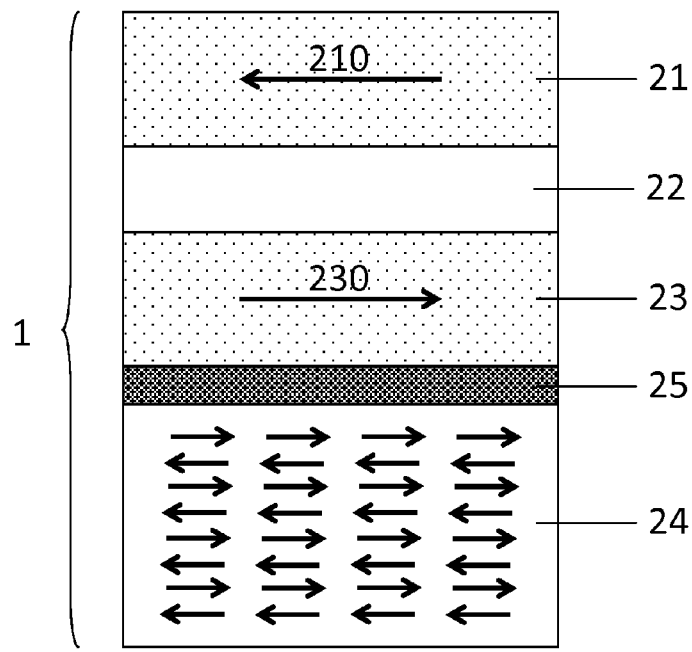
FIG. 1 is a schematic representation of a magnetoresistive element comprising an intermediate layer, according to an embodiment.

In an embodiment represented in FIG. 1, a magnetoresistive element 1 comprises a magnetic tunnel junction comprising a first magnetic layer 21 having a first magnetization 210; a second magnetic layer 23 having a second magnetization 230; a tunnel barrier layer 22 comprised between the first and the second magnetic layers 21, 23; and an antiferromagnetic layer 24 exchanged coupling the second magnetic layer 23 such that the second magnetization 230 is pinned below a critical temperature of the antiferromagnetic layer 24 and can be freely varied when the antiferromagnetic layer 24 is heated at or above that critical temperature. The first and second magnetic layer 23 can comprise one or more of a CoFe, CoFeB or NiFe layer, or more generally a Co, Ni or Fe-based alloy. The antiferromagnetic layer 24 can comprise a manganese-based alloy, such as IrMn, PtMn or FeMn, a multilayer structure comprising a combination of manganese-based alloys, or any other suitable materials.

The magnetoresistive element 1 further comprises an intermediate layer 25 arranged such as to act as an oxygen getter and/or prevent manganese migration within the magnetic tunnel junction stack. The intermediate layer 25 is comprised between the second magnetic 23 and the antiferromagnetic material 24, or within the second magnetic layer 23.

To this end, the intermediate layer 25, or oxygen gettering layer, can comprise a metallic element such as magnesium, aluminum, tantalum, niobium, chromium, titanium, vanadium. In fact, the intermediate layer 25 can comprise any material that has better oxygen gettering properties than the antiferromagnetic layer 24 and/or the second magnetic layer 23.

In a preferred embodiment, the intermediate layer 25 comprises a material, such as magnesium, that is also able to block diffusion of manganese from the antiferromagnetic layer 24 into the second magnetic layer 23. Inhibiting diffusion of manganese from the antiferromagnetic layer 24 into the second magnetic layer 23 results in an enhanced exchange bias between the antiferromagnetic layer 24 and the second magnetic layer 23. The inhibited diffusion of manganese further allows the magnetoresistive element 1 to be higher temperature cycles without being degraded. The absence of manganese in the second magnetic layer 23 also diminishes possible galvanic corrosion of the second magnetic layer 23 due to the presence of the more noble manganese. Thus, the magnetoresistive element 1 should have enhanced resistance to temperature cycles and improved life-time.

The intermediate layer 25 should be thin enough such as to conserve a significant magnetic exchange coupling between the antiferromagnetic layer 24 and the second magnetic layer 23. In an embodiment, the thickness of the intermediate layer 25 is comprised between 0.1 nm and 3.0 nm and preferably the thickness of the intermediate layer 25 is about 0.2 nm.

Figure 2:
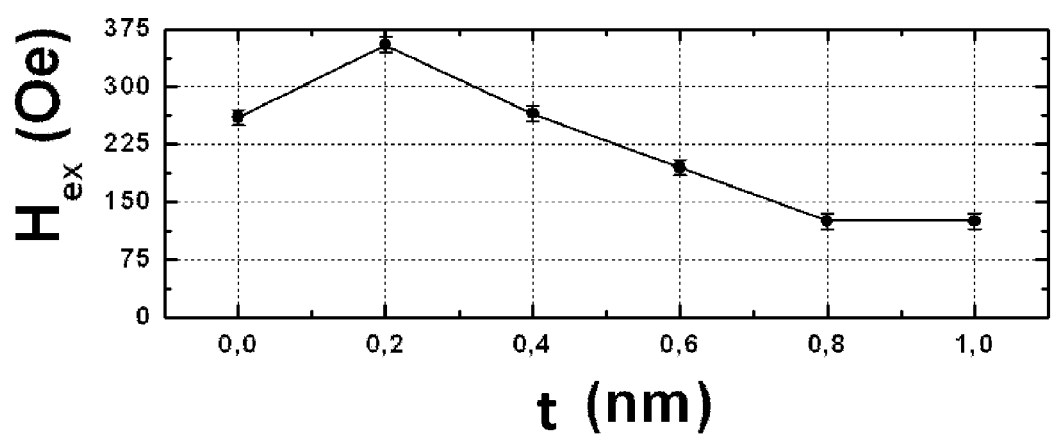
FIG. 2 reports the variation of the exchange bias field as a function of the thickness of the intermediate layer.

FIG. 2 reports the variation of the exchange bias field $H_{ex}$ as a function of the thickness t of the intermediate layer 25. In the example of FIG. 2, the magnetoresistive element 1 comprises a stack comprising Ta 5/Cu 3/FeMn 12/Mg t/NiFe 1.5/CoFe 1/MgO 1.4/Ta 5, wherein the stack was annealed at 300° C. for 90 min under a magnetic field of 1 T (in this particular stack the antiferromagnetic layer 24 is represented by the FeMn layer, the intermediate lamination 25 by the Mg layer and the storage layer 23 by the bilayer NiFe 1.5/CoFe 1. The tunnel barrier 22 is represented by the MgO layer). The intermediate layer 25 is made from magnesium. FIG. 2 shows a maximum in the exchange bias field $H_{ex}$ for a thickness of 0.2 nm of the intermediate layer 25 and that the exchange bias field $H_{ex}$ diminishes when the intermediate layer 25 is thicker than about 0.4 nm.

The magnetoresistive element 1 disclosed herein can be included in a MRAM cell, for example, further comprising possibly one or more current lines (not shown) used for addressing the magnetic tunnel junction of MRAM cell, and possibly a selection transistor (also not shown). More generally, the magnetoresistive element 1 comprising the intermediate layer 25 can be advantageously employed in all type of spintronic devices including MRAM cells and devices based on MRAM cells, spin transfer torque oscillators or magnetic logic units.

A magnetic memory device (not represented) can comprise, for example, a plurality of the MRAM cell comprising the magnetoresistive element 1 and arranged in rows and columns. The magnetic memory device can further comprise one or a plurality of current lines that connect the MRAM cells along a row and/or column.

REFERENCE NUMBERS 1 magnetoresistive element
21 first magnetic layer
210 first magnetization
23 second magnetic layer
230 second magnetization
24 antiferromagnetic layer
25 intermediate layer
$H_{ex}$ exchange bias field
t thickness

The invention claimed is:

1. Magnetoresistive element comprising a first magnetic layer having a first magnetization; a second magnetic layer having a second magnetization; a tunnel barrier layer comprised between the first and the second magnetic layers; and an antiferromagnetic layer, which comprises manganese, exchanged coupling the second magnetic layer such that the second magnetization is pinned below a critical temperature of the antiferromagnetic layer, and is freely varied when the antiferromagnetic layer is heated above the critical temperature;

the magnetoresistive element further comprising an oxygen getting layer which comprises material that has better oxygen gettering properties than the antiferromagnetic layer and/or the second magnetic layer, and wherein the oxygen getting layer is arranged in the magnetoresistive element such that it blocks diffusion of manganese from the antiferromagnetic layer into the second magnetic layer, wherein said oxygen gettering layer comprises magnesium and has a thickness of 0.2 nm.

2. Magnetoresistive element according to claim 1; wherein said oxygen gettering layer is comprised between the second magnetic layer and the antiferromagnetic layer.

3. Magnetoresistive element according to claim 1; wherein said oxygen gettering layer is comprised within the second magnetic layer.

4. Magnetoresistive element according to claim 1; wherein said oxygen gettering layer comprises one of aluminum, tantalum, niobium, chromium, titanium, vanadium.

5. Magnetoresistive element according to claim 1; wherein said oxygen gettering layer comprises a material which is immiscible with manganese.

6. MRAM cell comprising the magnetoresistive element characterized by claim 1.

7. Magnetic memory device comprising a plurality of the MRAM cell according to claim 6.

* * * * *